(12) United States Patent
Binet

(10) Patent No.: US 12,738,951 B2
(45) Date of Patent: Sep. 15, 2026

(54) INTEGRATED CIRCUIT COMPRISING A DIGITAL-TO-ANALOG CONVERTER

(71) Applicant: STMicroelectronics International N.V., Geneva (CH)

(72) Inventor: Vincent Binet, Aix en Provence (FR)

(73) Assignee: STMicroelectronics International N.V., Geneva (CH)

( * ) Notice: Subject to any disclaimer, the term of this patent is extended or adjusted under 35 U.S.C. 154(b) by 156 days.

(21) Appl. No.: 18/526,547

(22) Filed: Dec. 1, 2023

(65) Prior Publication Data

US 2024/0204686 A1 Jun. 20, 2024

(30) Foreign Application Priority Data

Dec. 16, 2022 (FR) ...................................... 2213546

(51) Int. Cl.
*H03M 1/06* (2006.01)
*H03M 1/66* (2006.01)

(52) U.S. Cl.
CPC ............ *H03M 1/0614* (2013.01); *H03M 1/66* (2013.01)

(58) Field of Classification Search
CPC .............................. H03M 1/0614; H03M 1/66
USPC ......................... 341/144, 118, 120, 135, 136
See application file for complete search history.

(56) References Cited

U.S. PATENT DOCUMENTS

2011/0316610 A1* 12/2011 Stockinger ........... H03K 17/102 327/437

FOREIGN PATENT DOCUMENTS

CN 110601682 A 12/2019

OTHER PUBLICATIONS

Wang et al., "On Low-Leakage CMOS Switches," 2021 IEEE International Midwest Symposium on Circuits and Systems (MWSCAS), IEEE Aug. 9, 2021, pp. 1-5, extracted on Aug. 9, 2021, Section III Figures 3-8.

Xin et al., "A power-efficient 12-bit analog-to-digital converter with a novel constant-resistance CMOS input sampling switch," Journal of Semiconductors, vol. 35, No. 2, 025002-1-025002-10, (Feb. 2014).

FR2213546 Search Report and Written Opinion mailed Jul. 10, 2023.

* cited by examiner

*Primary Examiner* — Peguy Jean Pierre
(74) *Attorney, Agent, or Firm* — Alston & Bird LLP

(57) ABSTRACT

According to one aspect, an integrated circuit is provided comprising: a digital-to-analog converter (MDAC) configured to convert a digital word (DIGW) into an analog signal (SDAC), a switching circuit including: a first transistor (PMOS1) having a drain configured to receive the analog signal (SDAC) and a source connected to a drain of a second transistor (PMOS2) and a third transistor (NMOS1) having a drain configured to receive the analog signal (SDAC) and a source connected to a drain of a fourth transistor (NMOS2); a voltage control circuit configured to apply a voltage on the source of the first transistor (PMOS1) and on the source of the third transistor (NMOS1) so as to limit a drain-source voltage of the first transistor (PMOS1) and a drain-source voltage of the third transistor (NMOS1) regardless of the value of said digital word.

10 Claims, 8 Drawing Sheets

[Fig 1]
IC
DACC
VCU
Rf
SWDAC
DIGW
MDAC
SDAC
AOP
Vp
OUTIO
Cload
Rload
MCU
SWUNBUF
OUTINT
INTD
EXTD
[Fig 2]
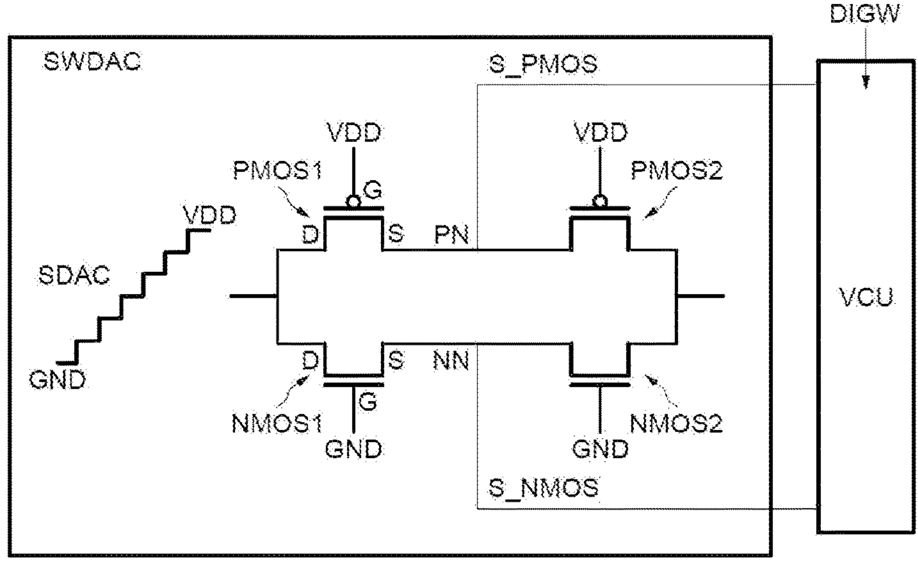

[Fig 3]
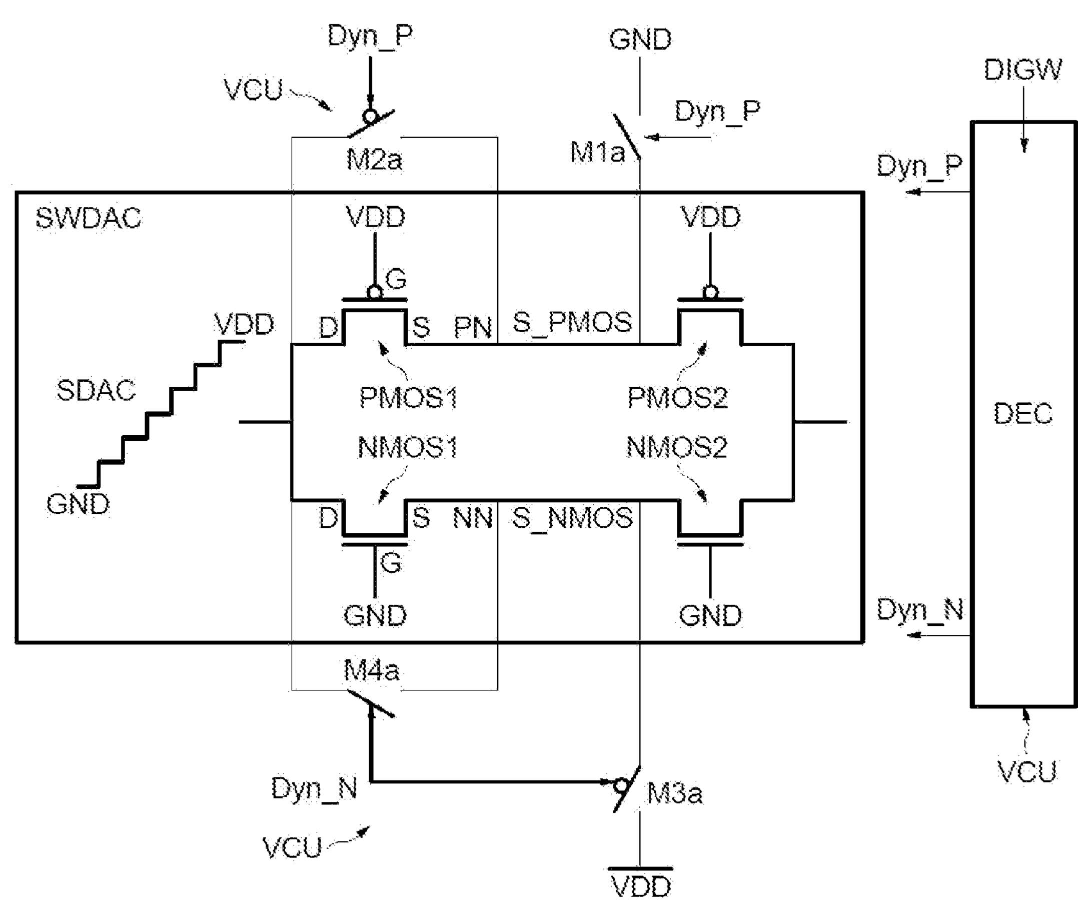
[Fig 4]

[Fig 5]
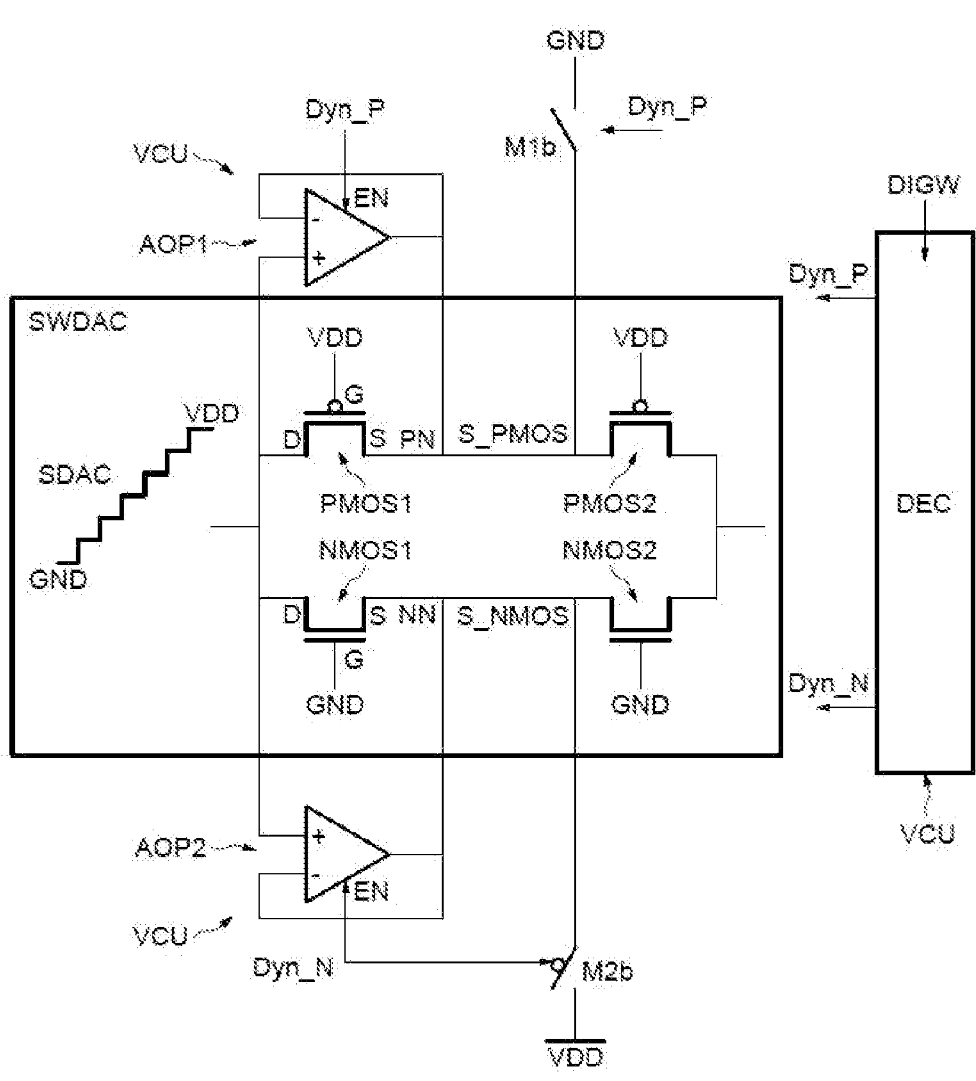

[Fig 6]
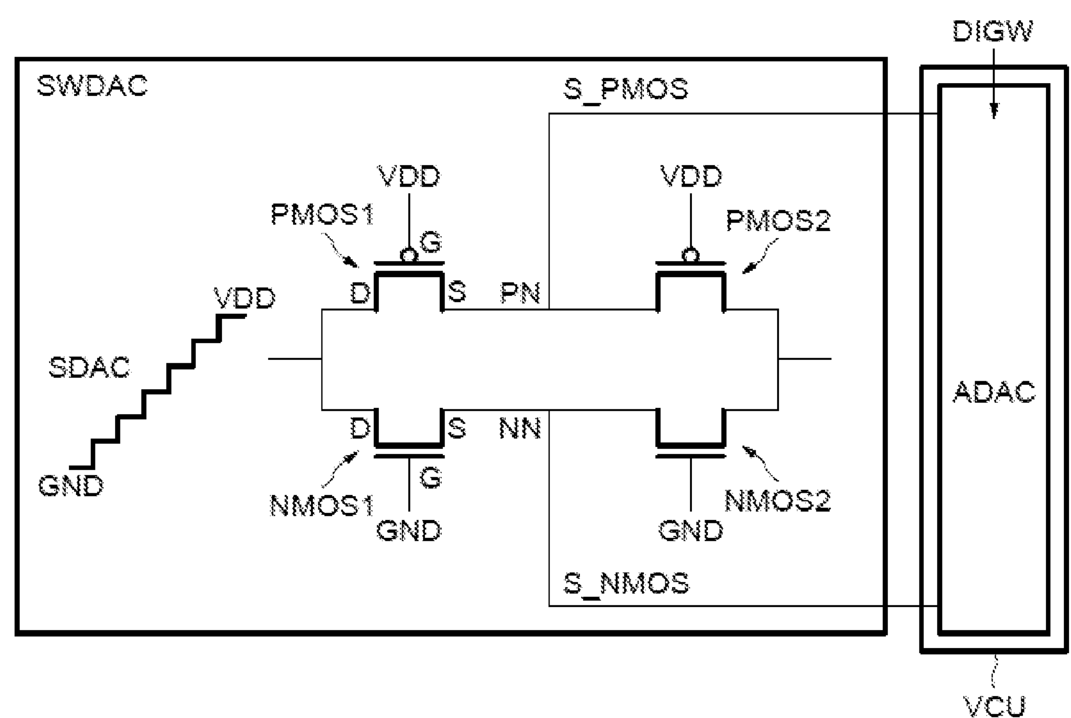

[Fig 7]

[Fig 8]
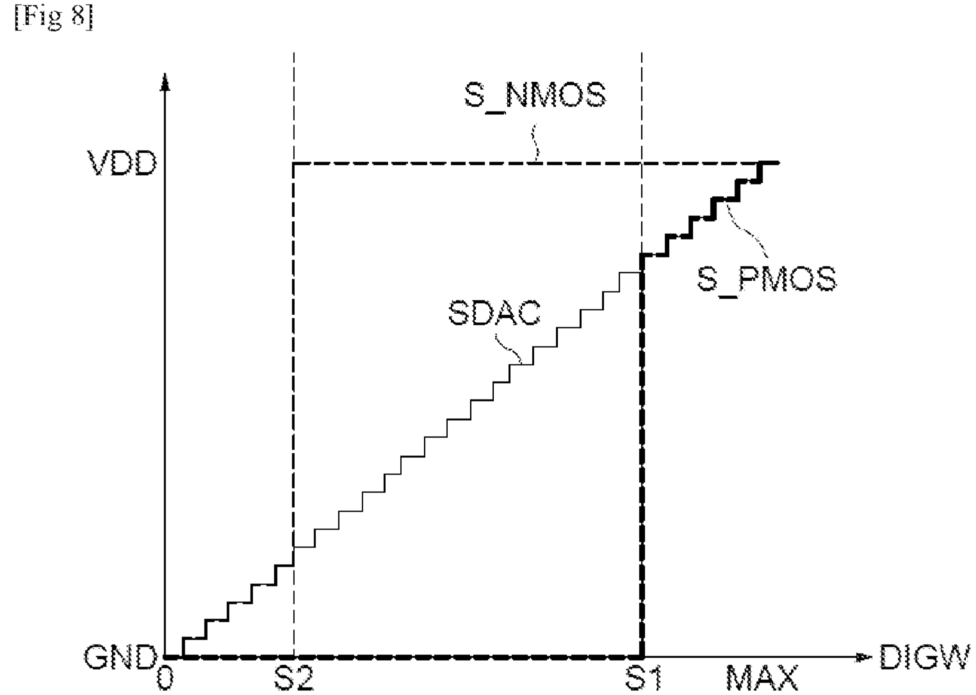

[Fig 9]
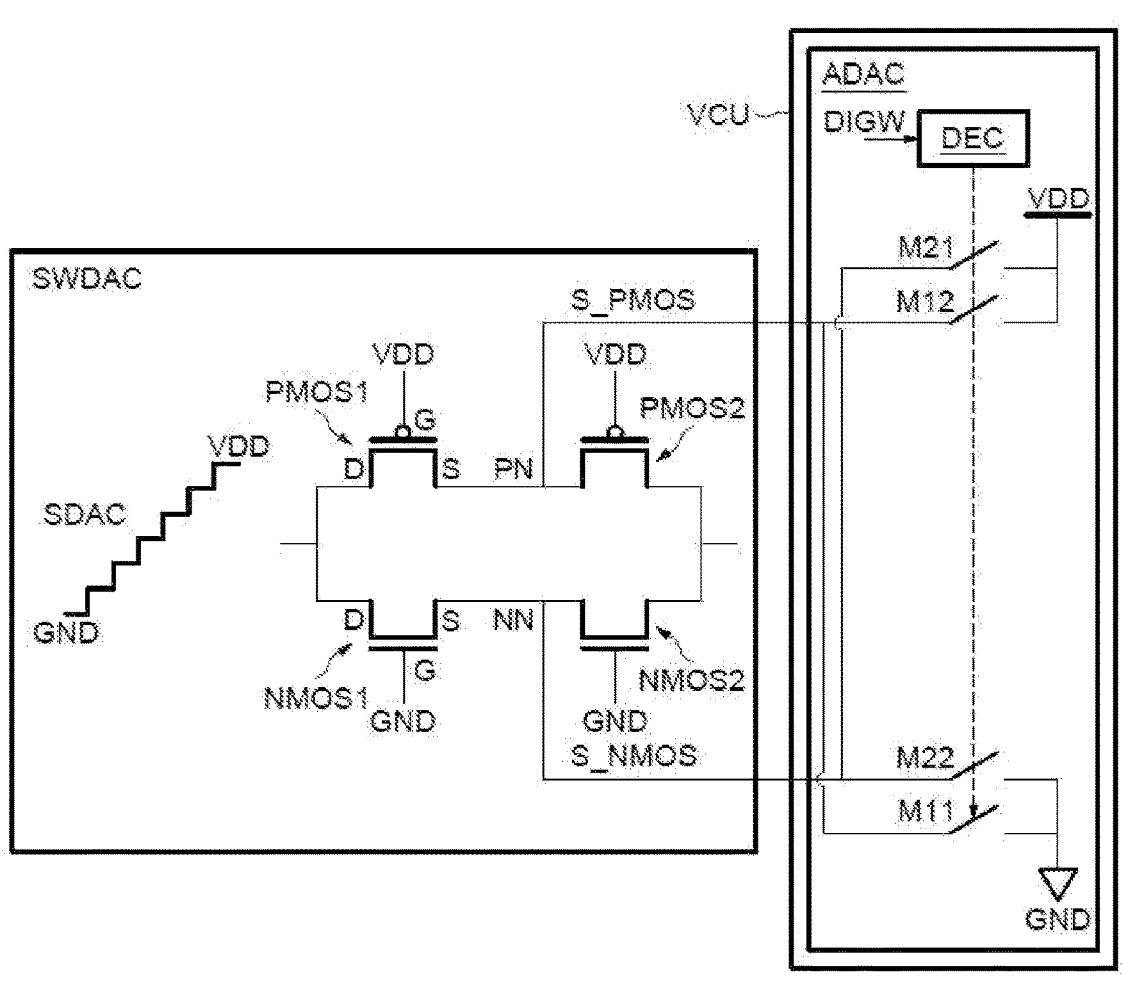

[Fig 10]
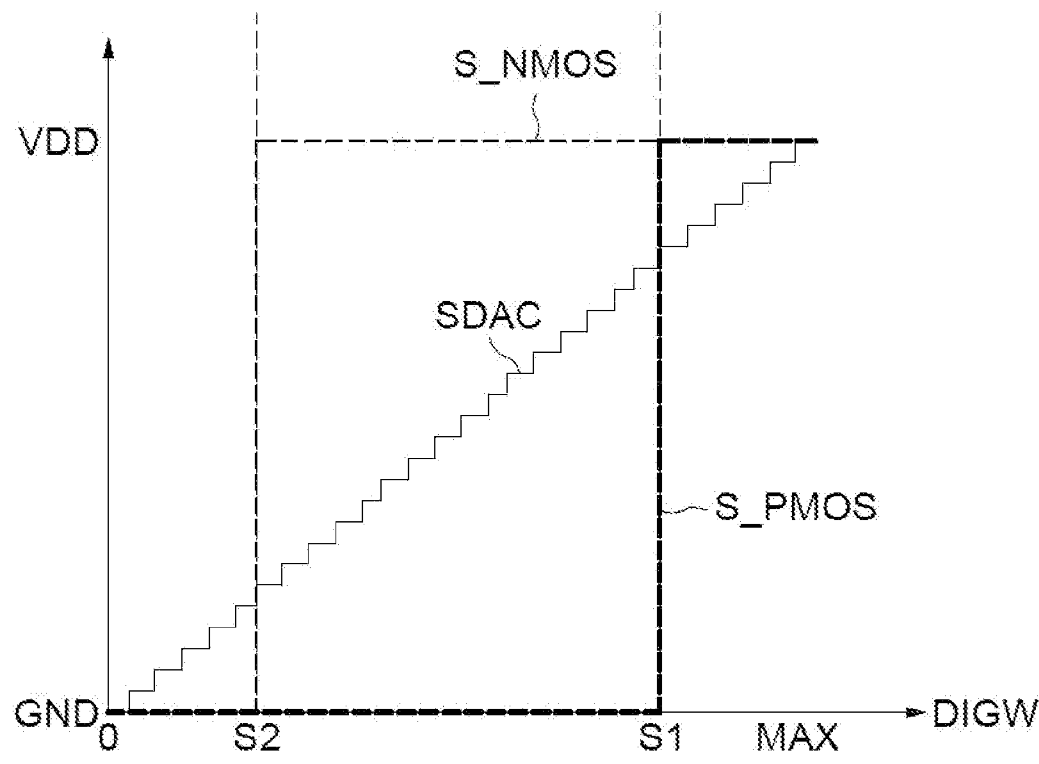

INTEGRATED CIRCUIT COMPRISING A DIGITAL-TO-ANALOG CONVERTER

CROSS REFERENCE TO RELATED APPLICATION

This application is a translation of and claims the priority benefit of French patent application number 2213546, filed on Dec. 16, 2022, entitled "CIRCUIT INTÉGRÉ COMPRENANT UN CONVERTISSEUR NUMÉRIQUE-ANALOGIQUE," which is hereby incorporated by reference to the maximum extent allowable by law.

TECHNICAL FIELD

Embodiments relate to integrated circuits, and more particularly those comprising a digital-to-analog converter.

BACKGROUND

Some integrated circuits are used to control electronic apparatuses. In particular, systems-on-chip and microcontrollers are integrated circuits generally used in embedded systems In general, such integrated circuits comprise a digital-to-analog converter. A digital-to-analog converter is an electronic device allows converting a digital signal (i.e. encoded over several bits) into an analog signal, in particular into an electrical voltage.

The analog signal may be used for different functions. For example, the analog signal may be used to control an electrical apparatus. In particular, the electrical apparatus may be a motor or a sensor. The analog signal may also be transmitted to other internal electronic components of the integrated circuit, such as a comparator, or an analog-to-digital converter or may be used as a reference signal.

An integrated circuit may have different operating modes enabling the digital-to-analog converter to fill different functions.

In particular, the integrated circuit may comprise switches at the output of the digital-to-analog converter for each mode of the integrated circuit. For example, a first switch may be located between the output of the digital-to-analog converter is an output of the integrated circuit configured to be connected to an electrical apparatus. A second switch may be located between the output of the digital-to-analog converter and of the internal electronic elements of the integrated circuit.

The integrated circuit comprises a control unit configured to close or open the switches at the output of the digital-to-analog converter according to the selected operating mode. For example, when the digital-to-analog converter is used to control an electronic apparatus, said first switch is closed and said second switch is open. Conversely, when the digital-to-analog converter is used for the operation of an internal electronic component of the integrated circuit, the second switch is closed and the first switch is open.

Moreover, some integrated circuits may be used for applications in which these integrated circuits are placed in a constraining environment. In particular, some applications impose temperatures on the integrated circuits which may be comprised between −40° C. and 140° C. These temperatures might affect the accuracy of the analog signals at the output of the digital-to-analog converters. Indeed, the high temperatures might induce current leakages affecting the analog value of the signal at the output of the digital-to-analog converters. Yet, current leakages might be high enough to modify the value of the analog signal at the output of the digital-to-analog converter by at least one step corresponding to a low-weight bit of the digital value.

In particular, the highest current leakages originate from the switch at the output of the digital-to-analog converter dedicated to the operating mode allowing controlling an electronic apparatus. The current leakages are higher when the digital-to-analog converter converts the lowest digital values or else the highest digital values. More particularly, these current leakages appear especially when this switch is open when the selected operating mode is that one allowing transmitting the analog signal generated by the digital-to-analog switch to an internal electronic element of the integrated circuit.

Hence, there is a need to provide a solution allowing reducing current leakages at the output of a digital-to-analog converter.

BRIEF SUMMARY

According to one aspect, an integrated circuit is provided comprising:

- a digital-to-analog converter configured to convert a digital word into an analog signal,
- a switching circuit including:
  - a PMOS-type first transistor having a drain configured to receive the analog signal and a source connected to a drain of a PMOS-type second transistor,
  - a NMOS-type third transistor having a drain configured to receive the analog signal and a source connected to a drain of a NMOS-type fourth transistor,
- a voltage control circuit configured to apply a voltage on the source of the first transistor and on the source of the third transistor so as to limit a drain-source voltage of the first transistor and a drain-source voltage of the third transistor regardless of the value of said digital word.

Such an integrated circuit allows limiting the drain-source voltage of the P-type first transistor and that one of the N-type third transistor regardless of the voltage of the analog signal generated by the digital-to-analog converter.

Thus, such an integrated circuit allows limiting current leakages throughout the P-type first transistor and the N-type third transistor regardless of the voltage of the analog signal generated by the digital-to-analog converter.

Hence, the integrated circuit allows obtaining a robust digital-to-analog conversion over a wide range of temperatures, comprised between −40° C. and 140° C.

Preferably, each of the PMOS-type second transistor and the NMOS-type fourth transistor has a source configured to be able to be connected to an electrical apparatus external to the integrated circuit.

Advantageously, the integrated circuit further comprises a switch having a first terminal configured to receive the analog signal generated by the digital-to-analog converter and a second terminal electrically connected to an electronic element internal to the integrated circuit.

In an advantageous embodiment, the integrated circuit further comprises a control unit configured to control the switching circuit and the switch according to an operating mode in order to transmit the analog signal generated by the digital-to-analog converter either towards the external electrical apparatus or towards the internal electronic element of the integrated circuit.

Such an integrated circuit is configured to limit current leakages throughout the switching circuit when this switching circuit is open and the switch connected to an internal electronic element of the integrated circuit is closed.

Advantageously, the voltage control circuit is configured to:

apply a zero voltage on the source of the PMOS-type first transistor when the value of the digital word is lower than a first threshold, and a voltage close to a voltage of the analog signal on the source of the first transistor when the value of the digital word is higher than the first threshold, so as to limit the drain-source voltage of the first transistor regardless of the value of said digital word, apply a voltage close to a voltage of the analog signal on the source of the NMOS-type third transistor when the value of the digital word is lower than a second threshold, and a voltage corresponding to a maximum voltage delivered by the digital-to-analog converter on the source of the third transistor when the value of the digital word is higher than the second threshold, the second threshold being lower than the first threshold, so as to limit the drain-source voltage of the third transistor regardless of the value of said digital word.

In one embodiment, the voltage control circuit comprises:

a first switch having a first terminal connected to the source of the first transistor and a second terminal connected to the ground, this switch being controlled by a first signal, a second switch having a first terminal connected to the first terminal of the switching circuit and a second terminal connected to the source of the first transistor, this switch being controlled by the first signal, a third switch having a first terminal connected to the source of the third transistor, and a second terminal configured to receive a voltage corresponding to a maximum voltage delivered by the digital-to-analog converter, this switch being controlled by an inverted second signal, a fourth switch having a first terminal connected to the first terminal of the switching circuit and a second terminal connected to the source of the third transistor, this switch being controlled by the second signal, a control circuit configured to generate the first signal and the second signal according to the value of the digital word, so as to limit the drain-source voltage of the first transistor and the drain-source voltage of the third transistor regardless of the value of said digital word.

In another embodiment, the voltage control circuit comprises:

a first switch having a first terminal connected to the source of the first transistor and a second terminal connected to the ground, this switch being controlled by a first signal, a first operational amplifier having a non-inverting input connected to the first terminal of the switching circuit, an output connected to the source of the first transistor and to an inverting input of this first operational amplifier, and a power supply input controlled by the inverted first signal, a second switch having a first terminal connected to the source of the third transistor, and a second terminal configured to receive a voltage corresponding to a maximum voltage delivered by the digital-to-analog converter, this second switch being controlled by an inverted second signal, a second operational amplifier having a non-inverting input connected to the first terminal of the switching circuit, an output connected to the source of the third transistor and to an inverting input of this second operational amplifier, and a power supply input controlled by the second signal, a control circuit configured to generate the first signal and the second signal according to the value of the digital word, so as to limit the drain-source voltage of the first transistor and the drain-source voltage of the third transistor regardless of the value of said digital word.

In another embodiment, the voltage control circuit comprises an auxiliary digital-to-analog converter configured to apply voltages on the source of the first transistor and on the source of the third transistor according to the value of the digital word so as to limit the drain-source voltage of the first transistor and the drain-source voltage of the third transistor regardless of the value of said digital word.

In particular, the auxiliary digital-to-analog converter may comprise:

a voltage divider circuit configured to generate voltages close to a voltage corresponding to a maximum voltage delivered by the digital-to-analog converter and voltages close to the ground, a first group of switches configured to apply said voltages close to the ground or the maximum voltage on the source of the first transistor, a second group of switches configured to apply said voltages close to the maximum voltage or the voltage of the ground on the source of the third transistor, a control circuit to control the switches of the auxiliary analog converter according to the value of the digital word so as to limit the drain-source voltage of the first transistor and the drain-source voltage of the third transistor regardless of the value of said digital word.

Alternatively, the auxiliary digital-to-analog converter comprises:

a first pair of switches configured to apply a voltage corresponding to a maximum voltage delivered by the digital-to-analog converter or a ground voltage on the source of the first transistor, a second pair of switches configured to apply the maximum voltage or a ground voltage on the source of the third transistor, a control circuit to control the pairs of switches of the auxiliary analog converter according to the value of the digital word so as to limit the drain-source voltage of the first transistor and the drain-source voltage of the third transistor regardless of the value of said digital word.

BRIEF DESCRIPTION OF THE DRAWINGS

Other advantages and features of the invention will appear upon examining the detailed description of non-limiting embodiments, and from the appended drawings wherein: [FIG. 1], [FIG. 2], [FIG. 3], [FIG. 4], [FIG. 5], [FIG. 6], [FIG. 7], [FIG. 8], [FIG. 9], and [FIG. 10] illustrate embodiments and implementations of the invention.

DETAILED DESCRIPTION

FIG. 1 illustrates an integrated circuit IC comprising a digital-to-analog conversion circuit DACC.

The digital-to-analog conversion circuit DACC comprises an input configured to receive a digital word DIGW.

The digital-to-analog conversion circuit also comprises several outputs. A first output OUTIO is configured to be connected to an electrical apparatus EXTD external to the integrated circuit IC. The electrical apparatus herein has a capacitive value Cload and a resistive value Rload. For example, the external electrical apparatus EXTD may be an electric motor or an electronic sensor.

A second output is configured to be connected to an internal electronic element INTD of the integrated circuit IC. For example, the electronic element INTD may be a comparator or an analog-to-digital converter.

The digital-to-analog conversion circuit DACC is configured to convert the digital word DIGW received thereby at the input into an analog signal SDAC that it could deliver to either one of the outputs OUTIO, OUTINT according to a selected operating mode.

In particular, the digital-to-analog conversion circuit further comprises a control unit MCU configured to control an operating mode of the digital-to-analog conversion circuit DACC. The operating mode of the digital-to-analog conversion circuit DACC allows selecting towards which output OUTIO, INTIO of the digital-to-analog conversion circuit DACC the analog signal SDAC should be transmitted. Thus, the operating mode allows selectively transmitting the analog signal towards an external electrical apparatus EXTD or towards an internal electronic element INTD of the integrated circuit IC.

More particularly, the analog signal SDAC may be used for different functions. For example, the analog signal SDAC may be used to control the electrical apparatus EXTD. In particular, the electrical apparatus EXTD may be a motor or a sensor. The analog signal SDAC may also be transmitted to internal electronic elements of the integrated circuit, such as a comparator, or an analog-to-digital converter or may be used as a reference signal.

The digital-to-analog conversion circuit DACC comprises a digital-to-analog converter MDAC. The digital-to-analog converter MDAC is configured to receive the digital word DIGW and to generate the analog signal SDAC according to this digital word DIGW. The digital-to-analog converter MDAC may be a resistive-type digital-to-analog converter.

The analog signal SDAC generated by the digital-to-analog converter MDAC has a voltage that depends on the value of the digital word DIGW. This value varies between a zero voltage (0 Volt) and a voltage VDD.

The digital-to-analog conversion circuit DACC further includes an operational amplifier AOP mounted as a follower. In particular, the amplifier AOP has an inverting input configured to receive the analog signal SDAC generated at the output of the digital-to-analog converter MDAC. The amplifier AOP also comprises a non-inverting input configured to receive a voltage Vp. The amplifier AOP has an output connected to the first output OUTIO of the digital-to-analog conversion circuit DACC. A resistive element Rf has a first terminal connected to the inverting input of the amplifier AOP and a second terminal connected to the output of the amplifier AOP. For example, the resistive element Rf has a resistive value comprised between Rdac and N*Rdac, where Rdac corresponds to a value of a unit resistance of the amplifier AOP and N corresponds to a desired gain for the amplifier AOP. For example, this resistive value may be comprised between 100 kΩ and 32*100 kΩ. Such an amplifier AOP serves as a buffer between the output of the digital-to-analog converter MDAC and the first output OUTIO of the digital-to-analog conversion circuit DACC.

The digital-to-analog conversion circuit DACC also includes a switching circuit SWDAC. The switching circuit SWDAC is placed between the output of the digital-to-analog converter MDAC and the inverting input of the amplifier AOP. Hence, the switching circuit SWDAC has a first terminal connected to the output of the digital-to-analog converter MDAC and a second terminal connected to the inverting input of the amplifier AOP. Thus, the inverting input of the amplifier AOP is configured to receive the analog signal SDAC generated at the output of the digital-to-analog converter MDAC through the switching circuit SWDAC, when the latter is closed. In particular, the switching circuit SWDAC is configured to be closed when the selected operating mode is that one used to transmit the analog signal SDAC generated by the digital-to-analog converter MDAC at the first output OUTIO of the digital-to-analog conversion circuit DACC towards an external electrical apparatus EXTD of the integrated circuit IC. The switching circuit SWDAC is configured to be open when another operating mode is selected.

The digital-to-analog conversion circuit DACC also includes a switch SWUNBUF. The switch SWUNBUF has a first terminal connected to the output of the digital-to-analog converter MDAC and a second terminal connected to the second output OUTINT of the digital-to-analog conversion circuit DACC. The switch SWUNBUF is configured to be closed when the selected operating mode is that one used to transmit the analog signal SDAC generated by the digital-to-analog converter MDAC at the second output OUTINT of the digital-to-analog conversion circuit DACC towards an internal electronic element INTD of the integrated circuit IC. The switch SWUNBUF is configured to be open when another operating mode is selected.

As illustrated in FIG. 2, the switching circuit SWDAC comprises two PMOS-type transistors PMOS1, PMOS2 mounted in series. A PMOS-type transistor is an insulated-gate field-effect transistor with a P-type channel. The switching circuit SWDAC also comprises two NMOS-type transistors NMOS1, NMOS2 mounted in series. A NMOS-type transistor is an insulated-gate field-effect transistor with a N-type channel. The transistors PMOS1, PMOS2 and the transistors NMOS1, NMOS2 are mounted in parallel between the two terminals of the switching circuit SWDAC.

The transistors PMOS1, PMOS2 have a gate G configured to be controlled by the control unit MCU with a voltage VDD to close them. The transistor PMOS1 has a drain connected to the first terminal of the switching circuit so as to be able to receive the analog signal SDAC generated by the digital-to-analog converter MDAC, and a source connected to a drain of the transistor PMOS2. The transistor PMOS2 has a source connected to the second terminal of the switching circuit SWDAC.

The transistors NMOS1, NMOS2 have a gate G configured to be controlled by the control unit MCU with a voltage GND to close them. The transistor NMOS1 has a drain connected to the first terminal of the switching circuit so as to be able to receive the analog signal SDAC generated by the digital-to-analog converter MDAC, and a source connected to a drain of the transistor NMOS2. The transistor NMOS2 has a source connected to the second terminal of the switching circuit SWDAC.

The digital-to-analog conversion circuit DACC also comprises a voltage control circuit VCU. The voltage control circuit VCU is configured to apply some voltages on a node PN between the transistors PMOS1, PMOS2 and on a node NN between the transistors NMOS1, NMOS2 according to the value of the digital word DIGW at the input of the digital-to-analog conversion circuit DACC. The voltage control circuit VCU is used in order to reduce current leakages throughout the transistors PMOS1 and NMOS1 when the switching circuit SWDAC is open, in particular when the selected operating mode allows transmitting the analog signal SDAC to an internal electronic element INTD of the integrated circuit.

The voltage control circuit VCU is configured to apply a voltage GND on the node PN between the transistors PMOS1, PMOS2 when the value of the digital word DIGW is lower than a given first threshold, and to apply a voltage close to a voltage VDD when the value of the digital word DIGW is higher than this first threshold so as to reduce the voltage VDS of the transistor PMOS1. This first threshold is selected according to the desired performances of the digital-to-analog conversion circuit DACC. In particular, this first threshold is selected in order to limit current leakages throughout the transistor PMOS1, when the value of the digital word DIGW is higher than the given first threshold. Indeed, such a control of the voltage at the node PN between the transistors PMOS1 and PMOS2 allows reducing the drain-source voltage of the transistor PMOS1 when the voltage of the analog signal SDAC generated by the digital-to-analog converter MDAC is close to VDD (i.e. when the value of the digital word DIGW is close to its maximum value MAX). Hence, the drain-source voltage of the transistor PMOS1 is always low regardless of the voltage of the analog signal generated by the digital-to-analog converter MDAC. Furthermore, forcing the node PN at the voltage GND when the value of the digital word DIGW is lower than the first threshold allows properly blocking the transistors PMOS1 and PMOS2, so as to properly isolate the output OUTINT from the output OUTIO.

The voltage control circuit VCU is configured to apply a voltage close to the ground GND on the node NN between the transistors NMOS1, NMOS2 when the value of the digital word DIGW is lower than a given second threshold so as to reduce the voltage VDS of the transistor NMOS1, and to apply a voltage VDD when the value of the digital word DIGW is higher than this second threshold. This second threshold is lower than the first threshold. This second threshold is selected according to the desired performances of the digital-to-analog conversion circuit DACC. In particular, this second threshold is selected in order to limit current leakages throughout the transistor NMOS1, when the value of the digital word DIGW is lower than the given second threshold. Indeed, such a control of the voltage at the node NN between the transistors NMOS1 and NMOS2 allows reducing the drain-source voltage of the transistor NMOS1 when the voltage of the analog signal SDAC generated by the digital-to-analog converter MDAC is close to GND (i.e. when the value of the digital word DIGW is close to its minimum value). Hence, the drain-source voltage of the transistor NMOS1 is always low regardless of the voltage of the analog signal SDAC generated by the digital-to-analog converter MDAC. Furthermore, forcing the node NN at the voltage VDD when the value of the digital word DIGW is higher than the second threshold allows properly blocking the transistors NMOS1 and NMOS2, so as to properly isolate the output OUTINT from the output OUTIO.

Thus, such a switching circuit SWDAC enables a good isolation from the external electrical apparatus EXTD.

Such a switching circuit SWDAC is also robust over a wide range of temperatures, in particular between −40° C. and 140° C., thanks to the control of the voltages at the nodes NN and PN which allows limiting current leakages.

The voltage control circuit VCU may be made according to different embodiments.

FIG. 3 illustrates a first embodiment of a voltage control circuit VCU.

The voltage control circuit VCU comprises a first switch M1*a* having a first terminal connected to the node PN between the source S of the transistor PMOS1 and the drain D of the transistor PMOS2, and a second terminal connected to the ground GND. This switch M1*a* is controlled by a signal Dyn_P. In this manner, the switch M1*a* is configured to be closed when the signal Dyn_P is in a high state, and open when the signal Dyn_P is in a low state.

The voltage control circuit VCU also comprises a second switch M2*a* having a first terminal connected to the first terminal of the switch circuit SWDAC and a second terminal connected to the node PN between the transistors PMOS1 and PMOS2. This switch M2*a* is controlled by the inverse of the signal Dyn_P. In this manner, the switch M2*a* is configured to be open when the signal Dyn_P is in a high state, and closed when the signal Dyn_P is in a low state.

The voltage control circuit VCU also comprises a third switch M3*a* having a first terminal connected to the node NN between the source S of the transistor NMOS1 and the drain D of the transistor NMOS2, and a second terminal configured to receive the voltage VDD. This switch M3*a* is controlled by the inverse of a signal Dyn_N. In this manner, the switch M3*a* is configured to be open when the signal Dyn_N is in a high state, and closed when the signal Dyn_N is in a low state.

The voltage control circuit VCU also comprises a fourth switch M4*a* having a first terminal connected to the first terminal of the switch circuit SWDAC and a second terminal connected to the node NN between the transistors NMOS1 and NMOS2. This switch M4*a* is controlled by the signal Dyn_N. In this manner, the switch M4*a* is configured to be closed when the signal Dyn_N is in a high state, and open when the signal Dyn_N is in a low state.

The voltage control circuit VCU also comprises a control circuit DEC configured to generate the signals Dyn_P and Dyn_N according to the value of the digital word DIGW received at the input of the digital-to-analog conversion circuit. Hence, the control circuit DEC has an input configured to receive the digital word DIGW, and two outputs configured to deliver the signals Dyn_P and Dyn_N respectively.

In particular, the signal Dyn_P is set in the high state when the value of the digital word DIGW is lower than a threshold S1. The signal Dyn_P is set in the low state when the value of the digital word DIGW is higher than the threshold S1. The signal Dyn_N is set in the high state when the value of the digital word DIGW is lower than a threshold S2. The signal Dyn_N is set in the low state when the value of the digital word DIGW is higher than the threshold S2.

Thus, the node PN between the transistors PMOS1 and PMOS2 is grounded GND when the value of the digital word DIGW is lower than the threshold S1, and is set at the voltage of the analog signal SWDAC generated by the analog-to-digital converter MDAC when the value of the digital word DIGW is higher than the threshold S1.

The node NN between the transistors NMOS1 and NMOS2 is set at the voltage of the analog signal SDAC generated by the analog-to-digital converter MDAC when the value of the digital word DIGW is lower than the threshold S2, and is set at the voltage VDD when the value of the digital word DIGW is higher than the threshold S2.

FIG. 4 illustrates a graph showing the value of the voltage at the node PN between the transistors PMOS1 and PMOS2 and of the voltage at the node NN between the transistors NMOS1 and NMOS2 as a function of the value of the digital word DIGW received at the input of the digital-to-analog conversion circuit DACC.

In particular, the curve SDAC illustrates the voltage of the analog signal SDAC at the output of the digital-to-analog converter MDAC. The curve S_PMOS illustrates the value of the voltage at the node PN between the transistors PMOS1 and PMOS2 as a function of the value of the digital word DIGW, and the curve S_NMOS illustrates the value of the voltage at the node NN between the transistors NMOS1 and NMOS2 as a function of the value of the digital word DIGW. The curve Dyn_P illustrates the value of the signal Dyn_P as a function of the value of the digital word DIGW, and the curve Dyn_N illustrates the value of the signal Dyn_N as a function of the value of the digital word DIGW.

The value of the voltage of the signal Dyn_P is equal to VDD when the value of the digital word DIGW is higher than the threshold S1, and to the ground GND when the value of the digital word DIGW is higher than the threshold S1.

Thus, the value of the voltage at the node PN between the transistors PMOS1 and PMOS2 is equal to the ground when the value of the digital word DIGW is lower than the threshold S1 of the digital word DIGW, and to the value of the voltage of the analog signal SDAC generated at the output of the digital-to-analog converter MDAC when the value of the digital word DIGW is higher than the threshold S1.

The value of the voltage of the signal Dyn_N is equal to VDD when the value of the digital word is lower than the threshold S2 of the digital word DIGW, and to the ground when the value of the digital word DIGW is higher than the threshold S2.

Thus, the value of the voltage at the node NN between the transistors NMOS1 and NMOS2 is equal to the value of the voltage of the analog signal SDAC generated at the output of the digital-to-analog converter MDAC when the value of the digital word DIGW is lower than the threshold S2, and to the voltage VDD when the value of the digital word DIGW is higher than the threshold S2.

FIG. 5 illustrates a second embodiment of a voltage control circuit VCU. The voltage control circuit VCU includes the same previously-described control circuit DEC. Hence, this control circuit DEC is used to generate the signals Dyn_P and Dyn_N in the same manner as described before.

The voltage control circuit VCU comprises a first switch M1*b* having a first terminal connected to the node PN between the source of the transistor PMOS1 and the drain of the transistor PMOS2, and a second terminal connected to the ground GND. This switch M1*b* is controlled by a signal Dyn_P. In this manner, the switch M1*b* is configured to be closed when the signal Dyn_P is in a high state, and open when the signal Dyn_P is in a low state.

The voltage control circuit VCU also comprises a first operational amplifier AOP1. This first operational amplifier AOP1 has a non-inverting input connected to the first terminal of the switching circuit SWDAC, an output connected to the node PN between the transistors PMOS1 and PMOS2, and to an inverting input of this first operational amplifier AOP1. The first operational amplifier AOP1 has a power supply input controlled by the signal Dyn_P. In particular, the first operational amplifier AOP1 is power when the signal Dyn_P is in the low state.

The voltage control circuit VCU also comprises a second switch M2*b* having a first terminal connected to the node NN between the source of the transistor NMOS1 and the drain of the transistor NMOS2, and a second terminal configured to receive the voltage VDD. This switch M2*b* is controlled by the inverse of the signal Dyn_N. In this manner, the switch M2*b* is configured to be open when the signal Dyn_N is in a high state, and closed when the signal Dyn_N is in a low state.

The voltage control circuit VCU also comprises a second operational amplifier AOP2. This second operational amplifier AOP2 has a non-inverting input connected to the first terminal of the switching circuit SWDAC, an output connected to the node between the transistors NMOS1 and NMOS2, and to an inverting input of this second operational amplifier AOP2. The second operational amplifier AOP2 has a power supply input EN controlled by the signal Dyn_N. In particular, the second operational amplifier AOP2 is powered when the signal Dyn_N is in the high state.

The value of the voltage of the signal Dyn_P is equal to VDD when the value of the digital word DIGW is higher than the threshold S1, and to the ground GND when the value of the digital word DIGW is higher than the threshold S1.

Thus, the value of the voltage at the node PN between the transistors PMOS1 and PMOS2 is equal to the ground when the value of the digital word DIGW is lower than the threshold S1, and to the value of the voltage of the analog signal SDAC generated at the output of the digital-to-analog converter MDAC when the value of the digital word DIGW is higher than the threshold S1.

The value of the voltage of the signal Dyn_N is equal to VDD when the value of the digital word is lower than the threshold S2 of the digital word DIGW, and to the ground when the value of the digital word DIGW is higher than the threshold S2.

Thus, the value of the voltage at the node NN between the transistors NMOS1 and NMOS2 is equal to the value of the voltage of the analog signal SDAC generated at the output of the digital-to-analog converter MDAC when the value of the digital word DIGW is lower than the threshold S2, and to the voltage VDD when the value of the digital word DIGW is higher than the threshold S2.

FIG. 6 illustrates a third embodiment of a voltage control circuit VCU. In this embodiment, the voltage control circuit VCU includes an auxiliary digital-to-analog converter ADAC. This auxiliary digital-to-analog converter ADAC is simplified in comparison with a digital-to-analog converter MDAC because it includes resistive elements with lower values in comparison with resistive elements of the digital-to-analog converter MDAC. Indeed, the auxiliary digital-to-analog converter ADAC does not have to be as accurate as the digital-to-analog converter MDAC. Thus, the auxiliary digital-to-analog converter ADAC is less requiring with regards to its accuracy and could therefore be simplified.

In particular, the auxiliary digital-to-analog converter ADAC has an input configured to receive the digital word DIGW received at the input of the digital-to-analog conversion circuit DACC.

The auxiliary digital-to-analog converter ADAC is configured to apply some voltages on the node PN between the transistors PMOS1 and PMOS2 and on the node NN between the transistors NMOS1 and NMOS2 according to the value of the digital word DIGW received at the input.

The auxiliary digital-to-analog converter ADAC may be made according to different embodiments.

Figure 7:
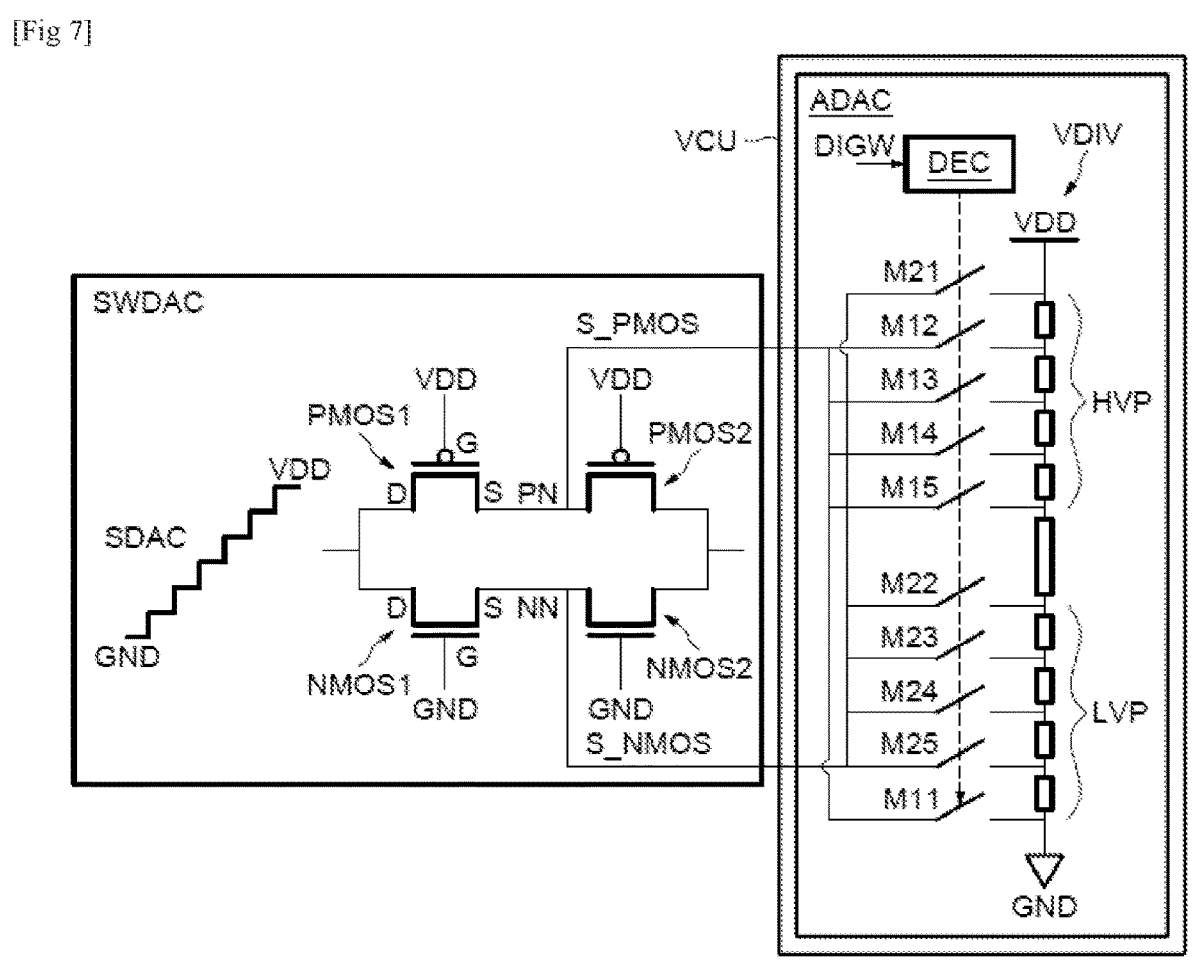

FIG. 7 illustrates a first embodiment of the auxiliary digital-to-analog converter ADAC.

The auxiliary digital-to-analog converter ADAC includes a voltage divider circuit VDIV. The voltage divider circuit VDIV comprises several resistors in series. The voltage divider circuit VDIV has a first terminal configured to receive the voltage VDD and a second terminal connected to the ground GND.

The voltage divider circuit VDIV has a portion, called high-voltage portion HVP, comprising a group of resistors allowing generating voltages close to the voltage VDD, for example comprised between VDD-50 mV and VDD. In particular, the voltages obtained by the high-voltage portion HVP correspond to the voltages of the analog signal generated by the digital-to-analog converter MDAC when the value of the digital word DIGW is higher than a first threshold.

The voltage divider circuit VDIV has a portion, called low-voltage portion LVP, comprising a group of resistors allowing generating voltages close to the ground GND, for example comprised between 0V and 50 mV. In particular, the voltages obtained by the low-voltage portion LVP correspond to the voltages of the analog signal generated by the digital-to-analog converter MDAC when the value of the digital word DIGW is lower than a second threshold, this second threshold being lower than the first threshold.

The auxiliary digital-to-analog converter ADAC further includes several switches M11, M12, M13, M14, M15 and M21, M22, M23, M24, M25 each having a first terminal connected to the voltage divider circuit VDIV and a second terminal connected to the node PN between the transistors PMOS1 and PMOS2 or to the node NN between the transistors NMOS1 and NMOS2. In particular, a first group of switches includes the switches M11, M12, M13, M14, M15 having their second terminal connected to the node PN between the transistors PMOS1 and PMOS2 and a second group of switches includes the switches M21, M22, M23, M24, M25 having their second terminal connected to the node NN between the transistors NMOS1 and NMOS2.

More particularly, the first group of switches includes a switch M11 having a first terminal connected to the ground GND and switches M12, M13, M14, M15 having a first terminal connected to nodes of the high-voltage portion HVP of the voltage divider circuit VDIV. The second group of switches includes a switch M21 having a first terminal configured to receive the voltage VDD and switches M22, M23, M24, M25 having a first terminal connected to nodes of the low-voltage portion LVP of the voltage divider circuit VDIV.

The first group of switches is controlled according to the voltage that should be applied on the node PN between the transistors PMOS1 and PMOS2 and the second group of switches is controlled according to the voltage that should be applied on the node NN between the transistors NMOS1 and NMOS2.

In particular, the auxiliary digital-to-analog converter ADAC comprises a control circuit DEC having an input configured to receive the digital word DIGW received at the input of the digital-to-analog conversion circuit DACC. The control circuit DEC is configured to control the switches of the auxiliary analog converter ADAC according to the value of the digital word DIGW received thereby so as to apply desired voltages on the node between the transistors PMOS1 and PMOS2 and on the node between the transistors NMOS1 and NMOS2.

FIG. 8 illustrates a graph showing the voltages applied on the node PN between the transistors PMOS1 and PMOS2 and on the node NN between the transistors NMOS1 and NMOS2 by the auxiliary digital-to-analog converter ADAC described with reference to FIG. 7 according to the value of the digital word DIGW received at the input of the digital-to-analog conversion circuit DACC.

The curve SDAC illustrates the voltage of the analog signal SDAC at the output of the digital-to-analog converter MDAC.

The curve S_PMOS illustrates the voltage applied on the node PN between the transistors PMOS1 and PMOS2 by the auxiliary digital-to-analog converter ADAC as a function of the value of the digital word DIGW received at the input of the digital-to-analog conversion circuit DACC.

The curve S_NMOS illustrates the voltage applied on the node NN between the transistors NMOS1 and NMOS2 by the auxiliary digital-to-analog converter ADAC as a function of the value of the digital word DIGW received at the input of the digital-to-analog conversion circuit DACC.

In particular, the switches M11, M12, M13, M14, M15 of the first group of switches are controlled so that the value of the voltage at the node PN between the transistors PMOS1 and PMOS2 is equal to the ground GND when the value of the digital word DIGW is lower than the threshold S1, and to a value corresponding to the value of the voltage of the analog signal SDAC generated at the output of the digital-to-analog converter MDAC when the value of the digital word DIGW is higher than the threshold S1.

The switches M21, M22, M23, M24, M25 of the second group of switches are controlled so that the value of the voltage at the node NN between the transistors NMOS1 and NMOS2 is equal to a value corresponding to the value of the voltage of the analog signal SDAC generated at the output of the digital-to-analog converter MDAC when the value of the digital word DIGW is lower than the threshold S2, and to the voltage VDD when the value of the digital word DIGW is higher than the threshold S2.

FIG. 9 illustrates a second embodiment of the auxiliary digital-to-analog converter ADAC. The auxiliary digital-to-analog converter ADAC includes two pairs of switches M11, M12 and M21, M22.

A first pair of switches comprises a first switch M11 having a first terminal connected to the ground GND and a second terminal connected to the node PN between the transistors PMOS1 and PMOS2.

This first pair of switches M11, M12 also comprises a second switch M12 having a first terminal configured to receive the voltage VDD and a second terminal connected to the node PN between the transistors PMOS1 and PMOS2.

A second pair of switches comprises a first switch M21 having a first terminal configured to receive the voltage VDD and a second terminal connected to the node NN between the transistors NMOS1 and NMOS2.

This second pair of switches M11, M12 also comprises a second switch M22 having a first terminal connected to the ground GND and a second terminal connected to the node NN between the transistors NMOS1 and NMOS2.

The first pair of switches M21, M22 is controlled according to the voltage that should be applied on the node PN between the transistors PMOS1 and PMOS2 and the second pair of switches is controlled according to the voltage that should be applied on the node NN between the transistors NMOS1 and NMOS2.

In particular, the auxiliary digital-to-analog converter ADAC comprises a control circuit DEC having an input configured to receive the digital word DIGW received at the input of the digital-to-analog conversion circuit DACC. The control circuit DEC is configured to control the switches M11, M12 and M21, M22 of the auxiliary analog converter ADAC according to the value of the digital word DIGW received thereby so as to apply desired voltages on the node PN between the transistors PMOS1 and PMOS2 and on the node NN between the transistors NMOS1 and NMOS2.

FIG. 10 illustrates a graph showing the voltages applied on the node PN between the transistors PMOS1 and PMOS2 and on the node NN between the transistors NMOS1 and NMOS2 by the auxiliary digital-to-analog converter ADAC described with reference to FIG. 9 according to the value of the digital word DIGW received at the input of the digital-to-analog conversion circuit DACC.

The curve SDAC illustrates the voltage of the analog signal SDAC at the output of the digital-to-analog converter MDAC.

The curve S_PMOS illustrates the voltage applied on the node PN between the transistors PMOS1 and PMOS2 by the auxiliary digital-to-analog converter ADAC as a function of the value of the digital word DIGW received at the input of the digital-to-analog conversion circuit DACC.

The curve S_NMOS illustrates the voltage applied on the node NN between the transistors NMOS1 and NMOS2 by the auxiliary digital-to-analog converter ADAC as a function of the value of the digital word DIGW received at the input of the digital-to-analog conversion circuit DACC.

In particular, the switches M11, M12 of the first group of switches are controlled so that the value of the voltage at the node PN between the transistors PMOS1 and PMOS2 is equal to the ground GND when the value of the digital word DIGW is lower than the threshold S1, and to the voltage VDD when the value of the digital word DIGW is higher than the threshold S1.

The switches M21, M22 of the second group of switches are controlled so that the value of the voltage at the node NN between the transistors NMOS1 and NMOS2 is equal to a value equal to the ground GND when the value of the digital word DIGW is lower than the threshold S1, and to the voltage VDD when the value of the digital word DIGW is higher than the threshold S2.

The invention claimed is:

1. An integrated circuit comprising:

a digital-to-analog converter configured to convert a digital word into an analog signal, a switching circuit connected to an output of the digital-to-analog converter and configured to receive the analog signal, wherein the switching circuit includes:

a PMOS-type first transistor having a drain and a source, wherein the drain is connected to the output of the digital-to-analog converter and configured to receive the analog signal generated by the digital-to-analog converter, and wherein the source is connected to a drain of a PMOS-type second transistor, a NMOS-type third transistor having a drain and a source, wherein the drain is connected to the output of the digital-to-analog converter and the drain of the PMOS-type first transistor and configured to receive the analog signal generated by the digital-to-analog converter, and the source is connected to a drain of a NMOS-type fourth transistor, and a voltage control circuit connected in parallel to the digital-to-analog converter and configured to receive the digital word and to apply a voltage on the source of the PMOS-type first transistor and on the source of the NMOS-type third transistor based on a value of the digital word, wherein the voltage applied on the source of the PMOS-type first transistor and on the source of the NMOS-type third transistor by the voltage control circuit is to limit a drain-source voltage of the PMOS-type first transistor and to limit a drain-source voltage of the NMOS-type third transistor regardless of the value of the digital word and the analog signal generated by the digital-to-analog converter based on the value of the digital word that is transmitted to the switching circuit.

2. The integrated circuit according to claim 1, wherein each of the PMOS-type second transistor and the NMOS-type fourth transistor has a source configured to be able to be connected to an electrical apparatus external to the integrated circuit.

3. The integrated circuit according to claim 2, further comprising a switch having a first terminal configured to receive the analog signal generated by the digital-to-analog converter and a second terminal electrically connected to an electronic element internal to the integrated circuit.

4. The integrated circuit according to claim 3, further comprising a control unit configured to control the switching circuit and the switch according to an operating mode in order to transmit the analog signal generated by the digital-to-analog converter either towards the electrical apparatus external to the integrated circuit or towards the electronic element internal to the integrated circuit.

5. The integrated circuit according to claim 4, wherein the voltage control circuit is configured to:

apply a zero voltage on the source of the PMOS-type first transistor when the value of the digital word is lower than a first threshold, and a voltage close to a voltage of the analog signal on the source of the PMOS-type first transistor when the value of the digital word is higher than the first threshold, so as to limit the drain-source voltage of the PMOS-type first transistor regardless of the value of said digital word, and apply a voltage close to a voltage of the analog signal on the source of the NMOS-type third transistor when the value of the digital word is lower than a second threshold, and a voltage corresponding to a maximum voltage delivered by the digital-to-analog converter on the source of the NMOS-type third transistor when the value of the digital word is higher than the second threshold, the second threshold being lower than the first threshold, so as to limit the drain-source voltage of the NMOS-type third transistor regardless of the value of said digital word.

6. The integrated circuit according to claim 5, wherein the voltage control circuit comprises:

a first switch having a first terminal connected to the source of the PMOS-type first transistor and a second terminal connected to a ground, this switch being controlled by a first signal, a second switch having a first terminal connected to the first terminal of the switching circuit and a second terminal connected to the source of the PMOS-type first transistor, this switch being controlled by the first signal, a third switch having a first terminal connected to the source of the NMOS-type third transistor, and a second terminal configured to receive a voltage corresponding to a maximum voltage delivered by the digital-to-analog converter, this switch being controlled by an inverted second signal, a fourth switch having a first terminal connected to the first terminal of the switching circuit and a second terminal connected to the source of the NMOS-type third transistor, this switch being controlled by a second signal, and a control circuit configured to generate the first signal and the second signal according to the value of the digital word, so as to limit the drain-source voltage of the PMOS-type first transistor and the drain-source voltage of the NMOS-type third transistor regardless of the value of said digital word.

7. The integrated circuit according to claim 5, wherein the voltage control circuit comprises:

a first switch having a first terminal connected to the source of the PMOS-type first transistor and a second terminal connected to a ground, this switch being controlled by a first signal, a first operational amplifier having a non-inverting input connected to the first terminal of the switching circuit, an output connected to the source of the PMOS-type first transistor and to an inverting input of this first operational amplifier, and a power supply input controlled by an inverted first signal, a second switch having a first terminal connected to the source of the NMOS-type third transistor, and a second terminal configured to receive a voltage corresponding to a maximum voltage delivered by the digital-to-analog converter, this second switch being controlled by an inverted second signal, a second operational amplifier having a non-inverting input connected to the first terminal of the switching circuit, an output connected to the source of the NMOS-type third transistor and to an inverting input of this second operational amplifier, and a power supply input controlled by a second signal, and a control circuit configured to generate the first signal and the second signal according to the value of the digital word, so as to limit the drain-source voltage of the PMOS-type first transistor and the drain-source voltage of the NMOS-type third transistor regardless of the value of said digital word.

8. The integrated circuit according to claim 5, wherein the voltage control circuit comprises an auxiliary digital-to-analog converter configured to apply voltages on the source of the PMOS-type first transistor and on the source of the NMOS-type third transistor according to the value of the digital word so as to limit the drain-source voltage of the PMOS-type first transistor and the drain-source voltage of the NMOS-type third transistor regardless of the value of said digital word.

9. The integrated circuit according to claim 8, wherein the auxiliary digital-to-analog converter comprises:

a voltage divider circuit configured to generate voltages close to a voltage corresponding to a maximum voltage delivered by the digital-to-analog converter and voltages close to a ground, a first group of switches configured to apply said voltages close to the ground or the maximum voltage on the source of the PMOS-type first transistor, a second group of switches configured to apply said voltages close to the maximum voltage or the voltage of the ground on the source of the NMOS-type third transistor, and a control circuit to control the first group of switches and the second group of switches of the auxiliary digital-to-analog converter according to the value of the digital word so as to limit the drain-source voltage of the PMOS-type first transistor and the drain-source voltage of the NMOS-type third transistor regardless of the value of said digital word.

10. The integrated circuit according to claim 8, wherein the auxiliary digital-to-analog converter comprises:

a first pair of switches configured to apply a voltage corresponding to a maximum voltage delivered by the digital-to-analog converter or a ground voltage on the source of the PMOS-type first transistor, a second pair of switches configured to apply the maximum voltage or a ground voltage on the source of the NMOS-type third transistor, and a control circuit to control the first pair of switches and the second pair of switches of the auxiliary digital-to-analog converter according to the value of the digital word so as to limit the drain-source voltage of the PMOS-type first transistor and the drain-source voltage of the NMOS-type third transistor regardless of the value of said digital word.

* * * * *